United States Patent [19]

Nazarenko

[11] 4,425,263

[45] Jan. 10, 1984

[54] FLEXIBLE SCREEN-PRINTABLE CONDUCTIVE COMPOSITION

[75] Inventor: Nicholas Nazarenko, West Chester, Pa.

[73] Assignee: E. I. Du Pont de Nemours & Co., Wilmington, Del.

[21] Appl. No.: 317,278

[22] Filed: Nov. 2, 1981

Related U.S. Application Data

[63] Continuation-in-part of Ser. No. 269,864, Jun. 3, 1981, abandoned.

[51] Int. Cl.³ .............................................. H01B 1/06
[52] U.S. Cl. .................................... 252/511; 252/512; 252/513; 252/514; 106/1.18; 106/1.19; 106/1.21

[58] Field of Search .............. 252/514, 513, 512, 511, 252/518, 519; 106/1.14, 1.19, 1.18, 290, 1.23, 308, 1.24, 311; 200/265, 292

[56] References Cited

U.S. PATENT DOCUMENTS

| | | | |
|---|---|---|---|
| 3,414,417 | 12/1968 | Miller et al. | 106/26 |
| 3,719,610 | 3/1973 | Prentice | 252/513 |
| 3,957,694 | 5/1976 | Bolon et al. | 252/514 |
| 3,968,056 | 7/1976 | Bolon et al. | 252/514 |
| 3,992,212 | 11/1976 | Youtsey et al. | 106/1 |
| 4,219,448 | 8/1980 | Ross | 252/500 |

*Primary Examiner*—Josephine Barr

[57] ABSTRACT

A screen-printable thick film conductor composition for membrane switches consisting of an active phase of conductive metal powder dispersed in an organic medium consisting essentially of a linear aromatic polyester resin dissolved in volatile solvent.

9 Claims, No Drawings

FLEXIBLE SCREEN-PRINTABLE CONDUCTIVE COMPOSITION

CROSS REFERENCE TO RELATED APPLICATION

This application is a continuation-in-part of U.S. application Ser. No. 269,864 filed June 3, 1981 and now abandoned.

FIELD OF THE INVENTION

This invention relates to a flexible, screen-printable conductive composition and, in particular, to a conductive composition useful for fabricating membrane touch switches.

A membrane touch switch is a momentary contact, low voltage switch which includes a first and a second switching element or membrane, disposed on opposite sides of an insulating membrane. The insulative membrane has appropriate apertures through which electrical contact between the switching elements may be made. Each switching element has a layer of conducting material formed in a predetermined circuit pattern on one surface thereof. One of the switching elements is connected to a source of electrical potential and the other to ground potential. An electrical circuit is completed when one of the switching elements is depressed and thus extended through the aperture in the insulating membrane to bring the conducting material disposed on the surface of that switching element into contact with the conducting material on the other switching element.

Typically, each of the switching elements includes a substrate of a flexible material, for example, a polyester film such as that sold by E. I. du Pont de Nemours and Company, Inc. under the trademark Mylar ®. Of course, other flexible materials, such as polycarbonate film or polyvinyl fluoride (PVF) film may be used as the flexible substrate. In some instances, the substrate of the upper switching elements is flexible, with the substrate of the base switching element being rigid.

The circuit pattern is usually formed on the switching element by applying onto the substrate a thick film paste composition containing particles of a conductive material dispersed in a volatile organic solvent-resin medium. After screen printing the composition is dried, ordinarily by heating, and the volatile organic material in the solvent-resin medium is driven off. The resin is left to bind together the conductive particles, thus forming the electrically conducting circuit pattern on the switching element.

Membrane touch switches are fabricated using either a semiautomatic or an automatic high speed (e.g., reel-to-reel) technique. In the semiautomatic processing technique, the substrate is manually fed to a printing apparatus and the composition is screen printed onto the surface of the substrate. In the automatic high speed reel-to-reel technique, a roll of substrate material is passed through an automatic printing station and through a drying station before being taken up on suitable take-up reels. The composition is automatically screen printed and dried.

The technology surrounding membrane touch switches in general, and the compositions therefor in particular, are continuously changing to satisfy more stringent environmental requirements, to provide lower operating costs, and to meet changing design criteria and increasing functional requirements imposed on them by the marketplace. Increased demands on paste composition functionality include more durability to harsh environmental changes, increased ability to use the switch at higher temperatures and increased abrasion resistance and increased resistance to high pressure electrical connectors. The most immediate market needs are perceived at this time to be lower processing costs and increased product capabilities. Processing costs can be reduced by providing paste compositions with better conductivity efficiency (i.e., greater conductivity per unit weight of conductive material), less and/or lower cost conductive material and higher throughput capability including longer screen life. One way of obtaining higher throughput capability is to utilize faster drying solvents in the solvent-resin media for both semiautomatic and high speed reel-to-reel processes.

SUMMARY OF THE INVENTION

The invention is directed primarily to a screen-printable conductor composition which is useful for making membrane touch switches, which consists essentially of 30-80% by weight finely divided particles of conductive material dispersed in 70-20% by weight organic medium which is a solution of linear polyester in nonhydrocarbon polar solvent, the weight ratio of resin to solvent being from 0.15 to 0.5.

In a second aspect, the invention relates to a method of making a membrane switching element comprising the steps of applying onto a flexible substrate by screen printing a composition as described above and drying the printed composition to remove the solvent therefrom. In a still further aspect the invention relates to the membrane switching element formed as the product of the method.

DETAILED DESCRIPTION OF THE INVENTION

A. Conductive Phase

The composition includes an active conductive phase, preferably silver, in fine flake particle form. The predominant portion of the flake silver powder has an average particle size in the range from about one to about ten microns. Based upon the total weight of the composition, the silver powder lies in the range from about 30 to about 80%. More preferably, the silver powder, by total weight of the composition, lies in the range from about 60 to about 65%. Although silver is the preferred conductive material, other conductive materials may be used as the active phase of the composition, including nickel, copper, carbon, iron, gold, platinum, palladium and mixtures and alloys thereof, as well as conductor-coated materials such as organic polymer particles coated by silver, copper or nickel.

So long as at least 30% by weight of the composition is conductive material, up to a maximum 40% by weight nonconductive filler particles can be used in the dispersed phase of the composition. Materials which can be used for this purpose include glass beads, clay and polymers which are insoluble in the polar solvent.

B. Organic Medium

The remainder of the composition (i.e., from about 70 to about 20%, by total weight of the composition) is organic medium. The organic medium consists essentially of 15 to about 30%, by weight of linear aromatic polyester resin dissolved in nonhydrocarbon polar solvent. Preferably the resin is approximately 25% by weight of the medium.

Typically, the polyester resins which are used in the invention are polycondensation products of an aromatic dicarboxylic acid such as isophthalic or terephthalic acid with a $C_{2-4}$ dihydroxy alkane such as ethylene or propylene glycol. Poly(ethylene isophthalate) is preferred.

It is also preferred that the polyester component have an intrinsic viscosity (I.V.) measured in a 60/40 by weight phenol/1,1,2,2-tetrachloroethane solution at 30° C. of from 0.5 to 1.0, 0.6 to 0.85 being preferred. Above about 1.0 I.V. the solubility characteristics of the resin are poorer and below about 0.5 I.V. the resin lacks sufficient strength to function adequately as a binder for the system.

Typically, the polyester resin used in the organic medium of the instant invention exhibits the following properties: specific gravity, in the range from about 1.2 to about 1.35; viscosity in carbitol acetate (15–30 weight %), in the range from about 1 to about 5 Pascal seconds at 22° C.; Tg, °C., in the range from about 25 to about 76; carboxyl number, eq/$10^6$ gm., in the range from about 35 to about 60; color, Gardner b, in the range from about 15 to about 30; softening point (R and B) °C., in the range from about 130 to about 165; tensile strength, psi, in the range from about 800 to about 8500; and solubility, up to 40% solids dissolvable in MEK at about 25° C. A preferred linear thermoplastic polyester resin is that sold by Goodyear Tire and Rubber Company, Akron, Ohio as Vitel ® linear thermoplastic polyester resin, grade number PE-200. A preferred linear thermoplastic polyester resin has the following physical properties: specific gravity, 1.25; viscosity in carbitol acetate (15–30 weight %), 1 to 5 Pascal seconds at 22° C.; Tg, °C., 67±5; carboxyl number, eq/$10^6$ gm., 50 max; Color, Gardner b, 30 max; moisture, %, 0.3 max; particle size, approximately ⅛" cubes, 100% through ¼" screen; solubility, 25% solids completely soluble in MEK at about 25° C.; softening point (R and B) °C., 155±8; and tensile strength, psi, 7800. The resin is dissolved in the solvent to form the organic medium.

The solvent component of the invention is a nonhydrocarbon polar solvent which must be capable of completely dissolving the linear aromatic polyester resin component of the organic medium. In addition, the solvent must be sufficiently volatile that it can be vaporized from the composition below the thermal degradation temperature of the flexible substrate. Such materials include esters, alcohols and ethers as well as halogenated aromatics. Though halogenated aromatics such dichlorobenzene are fully operable in the invention, they are not preferred because of the health hazards which may be associated with them. Preferred solvents therefore include materials such as ethylene glycol phenyl ether, benzyl alcohol, glycol ether acetates, and carbitol acetate. Carbitol acetate is especially preferred. Mixtures of various solvents will frequently be used in order to adjust the volatility of the solvent component of the organic medium.

In general, the boiling point of the solvent component(s) should be no less than about 150° C. A boiling point range of from 150° to 220° C. is preferred. Solvents having a boiling point below about 150° C. tend to thicken the composition excessively during screening as solvent is evaporated therefrom. This can, of course, can result in plugging of the screens which are used for printing patterns of the material onto the substrate. Within this limitation, however, the volatility of the solvent will be selected in consideration of the method of solvent removal and/or fabrication. For example, when the high speed reel-to-reel procedure is used it is essential that the solvent be removed quite rapidly during processing. Thus lower boiling solvent must be used such as those boiling from 150° to 175° C. On the other hand, when slower fabrication procedures are used, less volatile solvents may be used such as those boiling from 175° to 220° C. In either case the solvent removal is ordinarily accelerated by mildly heating the printed substrate. Typically, the substrate is heated in a hot air oven to 70° to 90° when using more volatile solvents in the reel-to-reel process and 90° to 120° C. when using less volatile solvents in the semiautomatic processes.

Ordinarily the solvent is present in the organic medium as the balance of the medium after loading of the resin. However, minor amounts of other additives can be added so long as they do not change the essence of the organic medium.

C. Substrate

Suitable substrates on which the compositions of the invention can be printed for use in membrane switches will ordinarily be organic polymer films having the properties of high flexibility, tensile strength, elasticity, dimensional stability and chemical inertness. Transparency is also a frequently desired property for such materials. Materials meeting these criteria include polyolefins such as polyethylene and polypropylene, polyesters, and polyvinyl halides such as polyvinyl chloride and polyvinyl fluoride. The most highly preferred and most widely used substrate material for membrane switches is polyester film, e.g., Mylar ® polyester film.

The invention will be more clearly understood by reference to the Examples which follows.

EXAMPLES

Example 1

An organic medium for the composition of the invention was prepared as follows: to 120 grams of magnetically stirred carbitol acetate (boiling point 215° C.) were added 40 grams of the preferred linear aromatic polyester resin described above. The mixture was heated to 100° C. and stirred at this temperature until the resin was completely dissolved (after approximately 8 hours). The solution was allowed to cool slowly to ambient temperature.

Example 2

A thick film screen printable composition was prepared from the organic medium of Example 1 as follows: a paste having 63% by weight of total composition was prepared by three roll milling 315 grams of flake silver powder with predominant particle size in the range from about one to about ten microns. The silver powder was mixed with 185 grams of the organic medium prepared in Example 1. The viscosity of the resultant paste after 24 hour ambient temperature rest measured about 33,000 centipoise (at 21° C.) on Brookfield RVT viscometer, 5 rpm, No. 5 spindle. The resultant paste composition was printed on a five mil electrical grade Mylar ® polyester film through a 200 mesh, stainless steel 1.0 mil epoxy emulsion screen. The printed parts were dried in a laboratory air circulating oven at 120° for ten minutes to form a switching element. The resultant printed and dried switching element was tested for resistivity, both before and after creasing, adhesion (using cellophane tape sold as Scotch brand, #810), scratch resistance and abrasion resistance.

Resistivity was measured using a Hewlett Packard 3466A digital voltmeter at K function and V auto range using single point probes. The switching element was measured for resistivity, then folded in against itself and out against itself so as to create a crease perpendicular to a conductor line.(A crease in and a crease out define one full crease.) Resistivity was then remeasured. Adhesion was measured with the switching element on a hard flat surface, and a two inch length of Scotch brand, #810 tape placed over approximately one inch of the printed conductor pattern. Smoothing pressure was applied with the fingers to insure good bonding of the tape adhesive to the switching element, then peeled back in an upward motion and checked for evidence of conductor transfer. The fingernail scratch test was perfomed with the switching element on a hard, flat surface. The element was scratched several times with the fingernail at moderate pressure perpendicular to the printed conductor pattern and checked for evidence of conductor removal. Abrasion resistance was measured by the pencil hardness test according to the procedure described in ASTM No. D-3363-74. The results observed are set forth in the following Table I which indicates for the amount of silver present, extremely high conductivity (low resistivity) was present, indicating excellent conductivity efficiency provided by the resin. In addition, the data of Table I indicate that the switching element exhibited very good adhesion, very good scratch resistance, good pencil hardness and acceptable resistivity after creasing.

TABLE I

| Dried Coating Thickness (mil) | Resistivity (mΩ/sq/mil) | Cellophane Tape Adhesion | Fingernail Scratch Test | Pencil Hardness | Resistivity After One Full Crease (mΩ/sq/mil) |
| --- | --- | --- | --- | --- | --- |
| .6 | 12 | Very good | Very good | 4H | 55 |

Examples 3 to 5

A series of switching elements was prepared in the manner of Example 2 in which the resin was varied within the range from 15 to 30% by weight of the medium. Compositions were prepared using 315 grams of silver powder as prepared in accordance with Example 1 dispersed in 185 grams of the media shown in Examples 2, 3 and 4. The paste compositions were screen printed and dried as discussed in Example 1 and properties tested. The results which are summarized in Table II indicate that the best overall performance was obtained with a medium wherein the resin was 25% of the total weight of the medium.

TABLE II

EFFECT OF RESIN CONCENTRATION IN 63% Ag PASTES DRIED AT 120° C. FOR 10 MINUTES

| Resin Content of organic Medium (%) wt | Wt (g) Resin: Ag | Resistivity (mΩ sq/mil) | Cellophane Tape Adhesion | Fingernail Scratch Test | Pencil Hardness | Resistivity After One Crease (mΩ/sq/mil) |
| --- | --- | --- | --- | --- | --- | --- |
| Example 3 | | | | | | |
| 15 | 0.3: 2.1 | 17 | Good | Fair | 2H | 31 |
| Example 4 | | | | | | |
| 25 | 0.5: 2.1 | 12 | V. Good | V. Good | 4H | 55 |
| Example 5 | | | | | | |
| 30 | 0.6: 2.1 | 20 | V. Good | V. Good | 4H | 1840 |

Examples 6–10

Examples 6–10 disclose thick film compositions containing of 50 to 80% weight silver powder prepared as in Example 1 loaded in a medium containing 25% resin and 75% carbitol acetate. The resultant pastes were screen printed and dried as discussed in connection with Example 1 and properties tested. The results are given in Table III below which indicates that the best results were obtained with a composition that contained silver powder in the range from about 60 to about 65% by total weight of the composition.

TABLE III

EFFECT OF Ag CONCENTRATION ON PASTE PROPERTY PERFORMANCE

| Ag Conc. (wt. % of Composition) | Resistivity (mΩ/sq/mil) | Cellophane Tape Adhesion | Fingernail Scratch test | Pencil Hardness | Resistivity After One Full Crease (mΩ/sq/mil) |
| --- | --- | --- | --- | --- | --- |
| Example 6 | | | | | |
| 50 | 56.1 | V. Good | V. Good | 4H | None |
| Example 7 | | | | | |
| 60 | 15.9 | V. Good | V. Good | 4H | 128 |
| Example 8 | | | | | |
| 65 | 12.3 | V. Good | V. Good | 4H | 50 |
| Example 9 | | | | | |
| 70 | 15.3 | Good | Good | B | 170 |
| Example 10 | | | | | |
| 80 | 11.1 | Fair | V. Poor | 3B | 1000 |

A screen printable composition in accordance with the instant invention has been found to provide increased conductivity and abrasion resistance (pencil hardness) when compared to various commercially available compositions. In addition, increased screen life, higher operating use temperatures and more durability to high pressure connectors have been observed. As a result, the screen printable composition of the instant invention provides the increased performance and lower processing costs demanded for membrane touch switches.

Example 11

An organic medium comprising 70 g of Cellosolve[1] acetate (boiling point 156.4° C.) and 30 g of PE-200 polyester resin (properties given hereinabove) was prepared by stirring the components at 80° C. Complete solution was obtained in about six hours after which the solution was cooled.

[1] Cellosolve is a tradename of Union Carbide Corp., New York, NY for mono- and dialkyl ethers of ethylene glycol and derivatives thereof.

A silver paste was prepared by three mill rolling a mixture of 64.5 g of silver powder (Du Pont P-3032), 31 g of the above-described organic medium and 4.5 g of 1-methylethylene glycol butylether (Propasol® Solvent B[2]) which has an atmospheric boiling point of 175° C.

[2] Propasol® is a tradename of Union Carbide Corp., New York, NY.

The viscosity of the paste after being held overnight under ambient conditions was 23,000 centipoiste (23° C.) on a Brookfield Viscometer at 5 rpm using a #5 spindle. This paste was used to print a 0.68 mil thick serpentine pattern on 5 mil thick EL Mylar®[3] film using a 280 mesh, stainless steel epoxy emulsion screen. After drying the printed pattern for 5 minutes at 90° C. in a laboratory air circulating oven, the pattern was tested in the manner described above. The properties of this element were found to be quite satisfactory as is indicated by the data in Table IV.

[3] Mylar® is a registered tradename of E. I. du Pont de Nemours and Company, Wilmington, Del. for polyester film.

TABLE IV

Effect of the Use of Mixed Solvents on Performance

| Resistivity (mΩ/sq/mil) | Cellophane Tape Adhesion | Fingernail Scratch Test | Pencil Hardness | Resistivity After One Full Crease (mΩ/sq/mil) |
| --- | --- | --- | --- | --- |
| 9.4 | V. Good | V. Good | 3H | 58 |

What is claimed is:

1. A screen-printable composition consisting essentially of (a) 30–80% by weight finely divided particles of conductive material selected from the group consisting of silver, nickel, copper, carbon, iron, gold, platinum, palladium and mixtures and alloys thereof dispersed in (b) 70–20% by weight organic medium which is a solution of linear aromatic polyester resin having an intrinsic viscosity of 0.5 to 1 completely dissolved in a volatile nonhydrocarbon solvent having a boiling point of 150°–220° C., the weight ratio of resin to solvent being from 0.15 to 0.5.
2. The composition of claim 1 in which the conductive material is silver.
3. The composition of claim 1 in which the conductive material is a glass or organic polymer coated with a material selected from the group consisting of silver, copper and nickel.
4. The composition of claim 1 in which the intrinsic viscosity of the polyester resin is 0.6 to 0.85.
5. The composition of claim 1 in which the polyester resin is the polycondensation product of a $C_{2-4}$ alkylene glycol with either isopthalic or terephthalic acid.
6. The composition of claim 5 in which the polyester resin is poly(ethylene terephthalate).
7. The composition of claim 1 in which the solvent has a boiling range of 150° to 220° C.
8. The composition of claim 7 in which the solvent is carbitol acetate.
9. The composition of claim 8 in which the solvent is admixed with 1-methyl ethylene glycol butylether.

* * * * *